US012764929B2

(12) United States Patent
Lu et al.

(10) Patent No.: US 12,764,929 B2
(45) Date of Patent: Oct. 13, 2026

(54) MEMORY DEVICE AND METHOD OF FORMING THE SAME

(71) Applicant: Winbond Electronics Corp., Taichung City (TW)

(72) Inventors: Chien-Ming Lu, Taichung City (TW); Tzu-Ming Ou Yang, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 628 days.

(21) Appl. No.: 17/994,393

(22) Filed: Nov. 28, 2022

(65) Prior Publication Data

US 2024/0179889 A1 May 30, 2024

(51) Int. Cl.
*H10B 12/00* (2023.01)
*H10W 20/41* (2026.01)

(52) U.S. Cl.
CPC ......... *H10B 12/312* (2023.02); *H10B 12/482* (2023.02); *H10W 20/435* (2026.01)

(58) Field of Classification Search
CPC .. H10B 12/312; H10B 12/482; H01L 23/5283
See application file for complete search history.

(56) References Cited

U.S. PATENT DOCUMENTS

2007/0152257 A1* 7/2007 Park .................. H01L 21/76831 438/399
2008/0064206 A1* 3/2008 Seo ...................... H10B 12/482 257/E21.495
2017/0345824 A1* 11/2017 Ma .................... H01L 21/76805
2020/0058654 A1* 2/2020 Yang .................... H10B 12/033
2021/0082741 A1* 3/2021 Chen ................. H01L 21/28568
2021/0398982 A1* 12/2021 Li ........................ H10B 12/482

OTHER PUBLICATIONS

"Office Action of Taiwan Counterpart Application", issued on Jan. 31, 2024, p. 1-p. 6.

* cited by examiner

*Primary Examiner* — Steven M Page
(74) *Attorney, Agent, or Firm* — JCIPRNET

(57) ABSTRACT

Provided is a memory device including a substrate, a plurality of bit-line structures, a plurality of conductive plugs, and a plurality of conductive pads. The substrate has a plurality of active areas. The plurality of bit-line structures are disposed on the substrate in parallel. The plurality of conductive plugs are respectively disposed aside the plurality of bit-line structures, and are electrically connected to the plurality of active areas. The plurality of conductive pads are vertically disposed between the plurality of conductive plugs and the plurality of active areas. One of the conductive plugs has a bottom area falls within a range of a top area of a corresponding conductive pad.

8 Claims, 14 Drawing Sheets

MEMORY DEVICE AND METHOD OF FORMING THE SAME

BACKGROUND OF THE INVENTION

Field of the Invention

The present invention relates to a memory device and a method of forming the same.

Description of Related Art

With development of technology, electronic products are developed towards the trend of lightness, slimness, shortness and smallness. However, under this trend, the critical dimension of the dynamic random access memory (DRAM) is also gradually shrinking, which result in many challenges for the DRAM process. For example, the contact resistance between the capacitor contact and the active area will increase as the critical dimension shrinks, thereby reducing the reliability of the memory device.

SUMMARY OF THE INVENTION

The invention provides a memory device and a method of forming the same, in which the contact resistance between the capacitor contact and the active area can be reduced, thereby enhancing the reliability and the performance of the memory device.

The invention provides a method of forming a memory device including: forming a plurality of bit-line structures on a substrate, wherein the plurality of bit-line structures extend along a first direction; respectively forming a plurality of conductive lines between the plurality of bit-line structures to contact a plurality of active areas in the substrate; forming a sacrificial layer on the plurality of conductive lines; patterning the plurality of bit-line structures, the sacrificial layer, and the plurality of conductive lines to form a plurality of openings arranged along a second direction, wherein the plurality of openings at least cut off the plurality of conductive lines to form a plurality of conductive pads; forming a dielectric layer in the plurality of openings; removing the sacrificial layer to expose the plurality of conductive pads; and respectively forming a plurality of conductive plugs on the plurality of conductive pads.

The invention provides a memory device including a substrate, a plurality of bit-line structures, a plurality of conductive plugs, and a plurality of conductive pads. The substrate has a plurality of active areas. The plurality of bit-line structures are disposed on the substrate in parallel. The plurality of conductive plugs are respectively disposed aside the plurality of bit-line structures, and are electrically connected to the plurality of active areas. The plurality of conductive pads are vertically disposed between the plurality of conductive plugs and the plurality of active areas. One of the conductive plugs has a bottom area falls within a range of a top area of a corresponding conductive pad.

Based on above, the embodiment of the present invention provides a memory device and a method of forming the same which uses a plurality of conductive pads vertically disposed between a plurality of conductive plugs and a plurality of active areas to reduce the contact resistance between the capacitor contacts and the active areas. As such, even if the misalignment occurs due to the process variation, the short issue between the capacitor contact and the active area can also be avoided, thereby increasing the process window and enhancing the reliability of the memory device.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description. serve to explain the principles of the invention.

DESCRIPTION OF THE EMBODIMENTS

Figure 1:
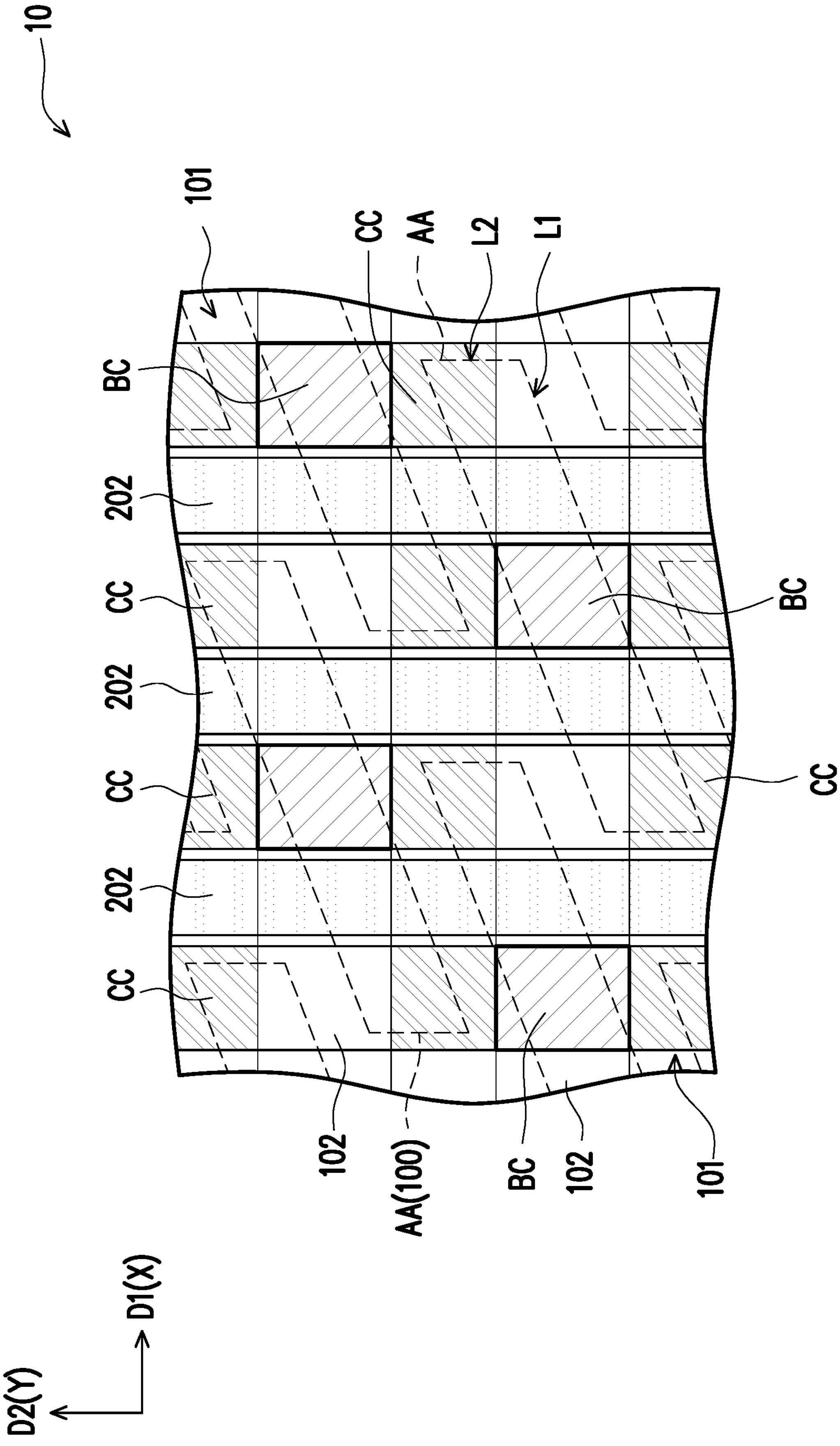
FIG. 1 is a schematic top view of a memory device according to an embodiment of the present invention.

The invention is illustrated more comprehensively referring to the drawings of the embodiments. However, the invention may be embodied in many different forms and should not be construed as limited to the embodiments set forth herein. Thicknesses of layers and regions in the drawings may be enlarged for clarity. Wherever possible, the same or similar reference numbers are used in the drawings and the description to refer to the same or similar devices, and are not repeated again in the following paragraphs.

FIG. 1 is a schematic top view of a memory device according to an embodiment of the present invention. The memory device in the following embodiments is illustrated by taking a dynamic random access memory as an example, but the present invention is not limited thereto. Referring to FIG. 1, the present embodiment provides a memory device 10 including: a substrate 100, a plurality of isolation structures 101, a plurality of active areas AA, a plurality of bit-line structures 102, a plurality of embedded word lines 202, a plurality of capacitor contacts CC, and a plurality of bit-line contacts BC.

As shown in FIG. 1, the substrate 100 includes the plurality of active areas AA. In an embodiment, the active areas AA may be formed by forming the isolation structures 101 in the substrate 100 to define the plurality of active areas AA in the substrate 100. That is, there is an isolation structure 101 between two adjacent active areas AA.

The bit-line structures 102 are located on the substrate 100 and across the active areas AA. In one embodiment, the bit-line structures 102 extend along a direction D1 (e.g., X direction), and are arranged alternately along a direction D2 (e.g., Y direction). The embedded word lines 202 are located in the substrate 100. In one embodiment, the embedded word lines 202 extend along the direction D2 and are arranged alternately along the direction D1. In the present embodiment, the direction D1 is substantially perpendicular to the direction D2.

As shown in FIG. 1, each active area AA has a long side L1 and a short side L2, and the long side L1 spans the corresponding two embedded word lines 202 and one bit-line structure 102. An overlap of each active area AA and its corresponding bit-line structure 102 has a bit-line contact BC. The bit-line contact BC is electrically connected to the bit-line structure 102 and the doped region in the corresponding active area AA. The doped region may be located between two embedded word lines 202.

The capacitor contacts CC are respectively disposed in the space surrounded by the embedded word lines 202 and the bit-line structures 102. In detail, the capacitor contacts CC are respectively disposed on the two terminals of the long side L1 of the active areas AA, which may be electrically connected to the active areas AA and subsequently formed capacitors (not shown).

It should be noted that as the critical dimension of the memory device shrinks, the size of the capacitor contacts CC also shrinks. In this case, the contact resistance between the capacitor contacts CC and the active areas AA will increase as the critical dimension shrinks, thereby reducing the reliability of the memory device. Therefore, in the embodiment of the present invention, the conductive pads vertically disposed between the conductive plugs and the active areas can be used to reduce the contact resistance between the capacitor contact and the active areas, thereby enhancing the reliability and the performance of the memory device. The detailed forming method is shown in the following paragraphs and figures.

FIG. 2A to FIG. 2H are schematic cross-sectional views of a manufacturing process of a memory device according to an embodiment of the invention. First, referring to FIG. 2A, an initial structure is provided, which includes a substrate 100, a plurality of isolation structures 101, and a plurality of bit-line structures 102. In an embodiment, the substrate 100 may be, for example, a semiconductor substrate, a semiconductor compound substrate, or a semiconductor substrate on an insulating layer. In the present embodiment, the substrate 100 is a silicon substrate.

Figure 2B:
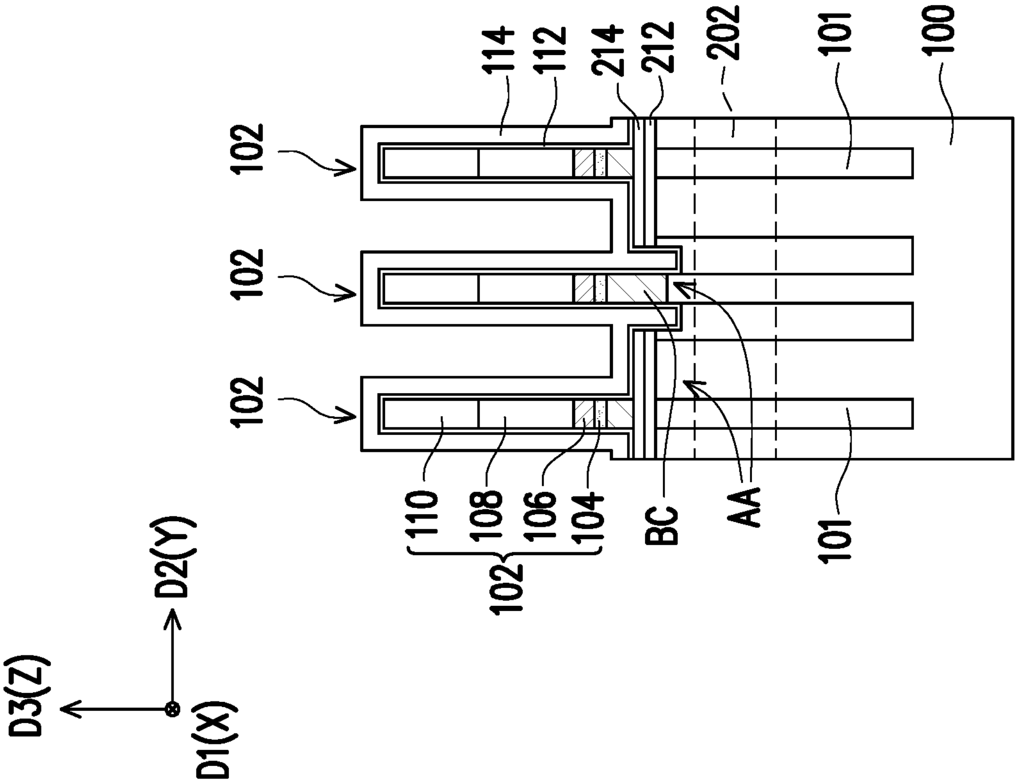
FIG. 2A to FIG. 2H are schematic cross-sectional views of a manufacturing process of a memory device according to an embodiment of the invention.
Figure 2A:
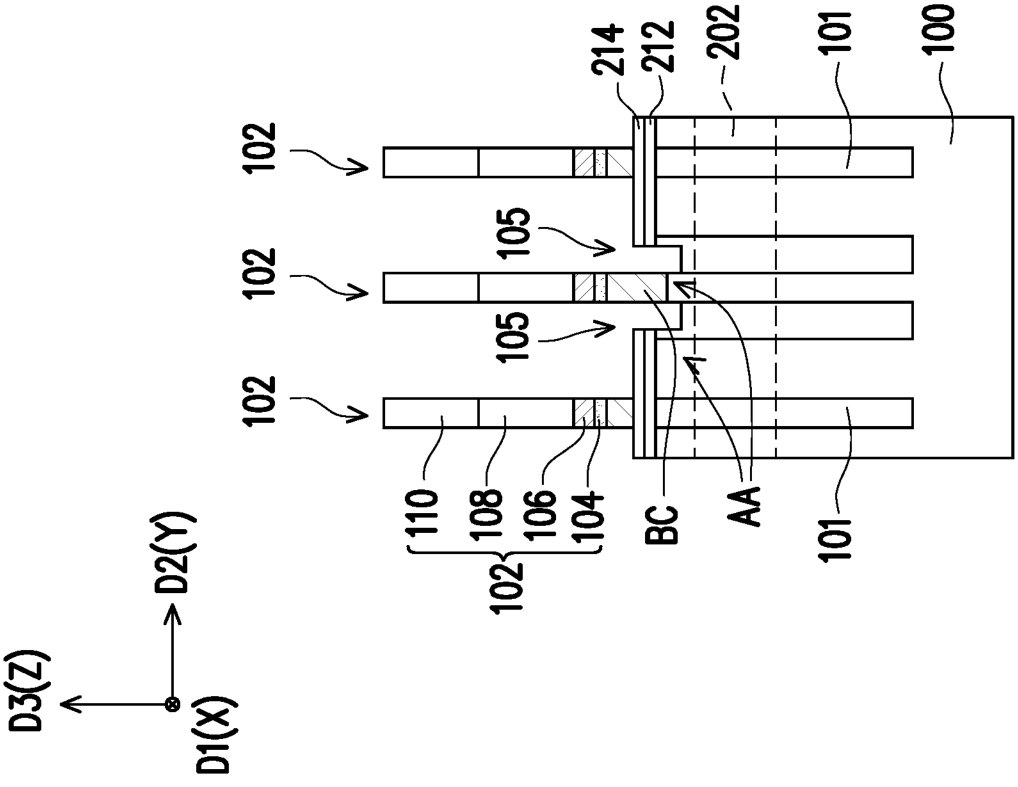

As shown in FIG. 2A, the isolation structures 101 are disposed in the substrate 100 to divide the substrate 100 into a plurality of active areas AA. In one embodiment, the isolation structures 101 include a dielectric material, and the dielectric material may be silicon oxide, silicon nitride, or a combination thereof. In addition, the isolation structures 101 may include a single-layered structure, a bi-layered structure, or a multi-layered structure. For example, the isolation structures 101 may include a first isolation layer and a second isolation layer lining the first isolation layer to separate the first isolation layer from the substrate 100. The first isolation layer may be a silicon nitride layer, while the second isolation layer may be a thermal oxide layer. In alternative embodiments, the isolation structures 101 may be, for example, shallow trench isolation structures.

As shown in FIG. 2A, the bit-line structures 102 are disposed on the substrate 100 in parallel and across the active areas AA. In one embodiment, the bit-line structures 102 extend along the direction D1 and are arranged alternately along the direction D2. Specifically, each bit-line structure 102 includes a barrier layer 104, a bit-line 106, a cap layer 108, and a mask layer 110 along a direction D3 (e.g., Z direction). As shown in FIG. 2A, the initial structure may further include the bit-line contacts BC. The bit-line contact BC is disposed at the overlap of each active area AA and the corresponding bit-line structure 102. Therefore, each bit-line structure 102 may be electrically connected to the corresponding active area AA by using the bit-line contact BC. In addition, it should be noted that, when defining the bit-line contacts BC, a plurality of openings 105 may be formed on both sides of the bit-line contacts BC to expose the sidewalls of the bit-line contacts BC.

In one embodiment, a material of the barrier layer 104 includes a barrier metal material, which may be, for example, Ti, TiN, Ta, TaN or a combination thereof. A material of the bit-line 106 may be a metal material such as W, for example. In addition, a thin metal silicide layer, such as tungsten silicide ($WSi^x$), may also be provided between the barrier layer 104 and the bit-line 106. A material of the cap layer 108 may be silicon nitride. A material of the mask layer 110 may be silicon oxide, carbon, silicon oxynitride, or a combination thereof. In the present embodiment, the mask layer 110 may be a multi-layered hard mask layer, but the invention is not limited thereto. A material of the bit-line contacts BC may include conductive material, such as doped polysilicon or silicon germanium.

In addition, the initial structure further includes a silicon oxide layer 212 and a silicon nitride layer 214. In detail, the silicon oxide layer 212 is disposed on the substrate 100 and extends to cover the top surface of the isolation structures 101. The silicon nitride layer 214 is disposed on the silicon oxide layer 212 and vertically disposed between the silicon oxide layer 212 and the bit-line structure 102.

Next, referring to FIG. 2B, a liner layer 112 is formed on the substrate 100. Specifically, the liner layer 112 conformally covers the structure illustrated in FIG. 2A to protect the bit-line structures 102, as shown in FIG. 2B. In one embodiment, a material of the liner layer 112 includes a dielectric material, such as silicon oxide, silicon nitride, silicon oxynitride, or a combination thereof. Next, a filling material layer 114 is formed on the liner layer 112. In one embodiment, a material of the filling material layer 114 includes a dielectric material such as silicon oxide, silicon nitride, silicon oxynitride, or a combination thereof. In the present embodiment, the liner layer 112 and the filling material layer 114 may include dielectric materials with different etch selectivities. For example, the liner layer 112 is a silicon oxide layer, while the filling material layer 114 is a silicon nitride layer.

Figure 2C:
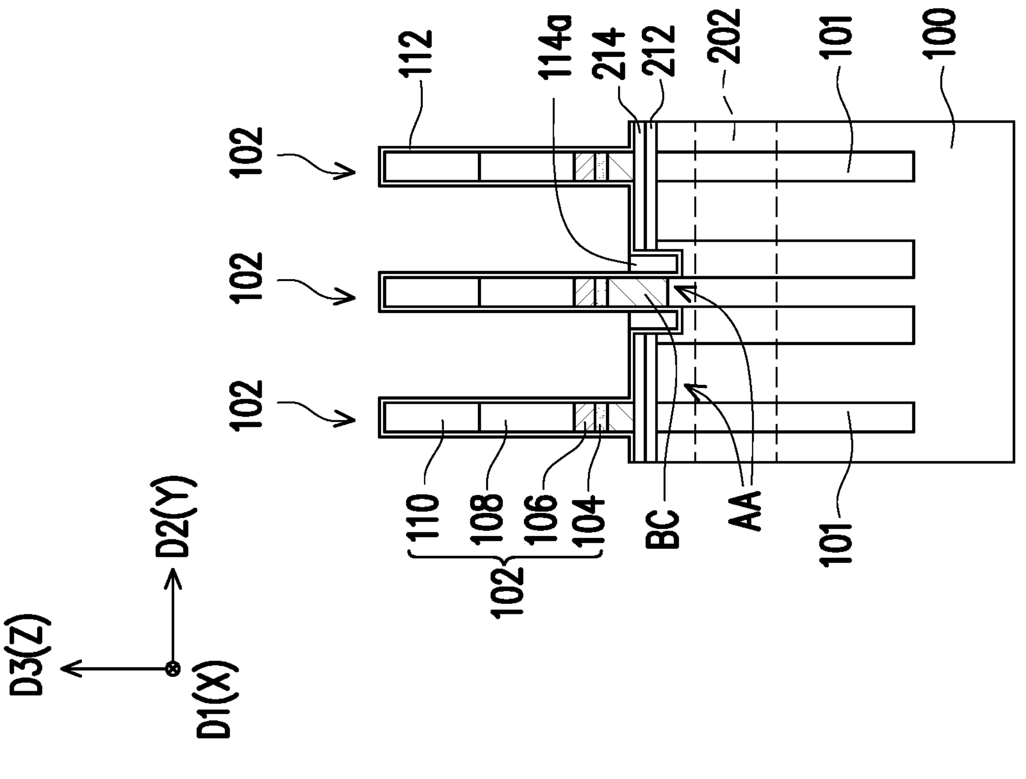

Referring to FIG. 2C, a first etching process is performed to remove a portion of the filling material layer 114 overlying the bit-line structures 102 to expose the underlying liner layer 112. In this case, the remaining filling material layer 114 is filled into the openings 105 to form a filling layer 114*a*. In one embodiment, the first etching process includes an anisotropic etching process, such as a reactive ion etching (RIE) process.

Figure 2D:
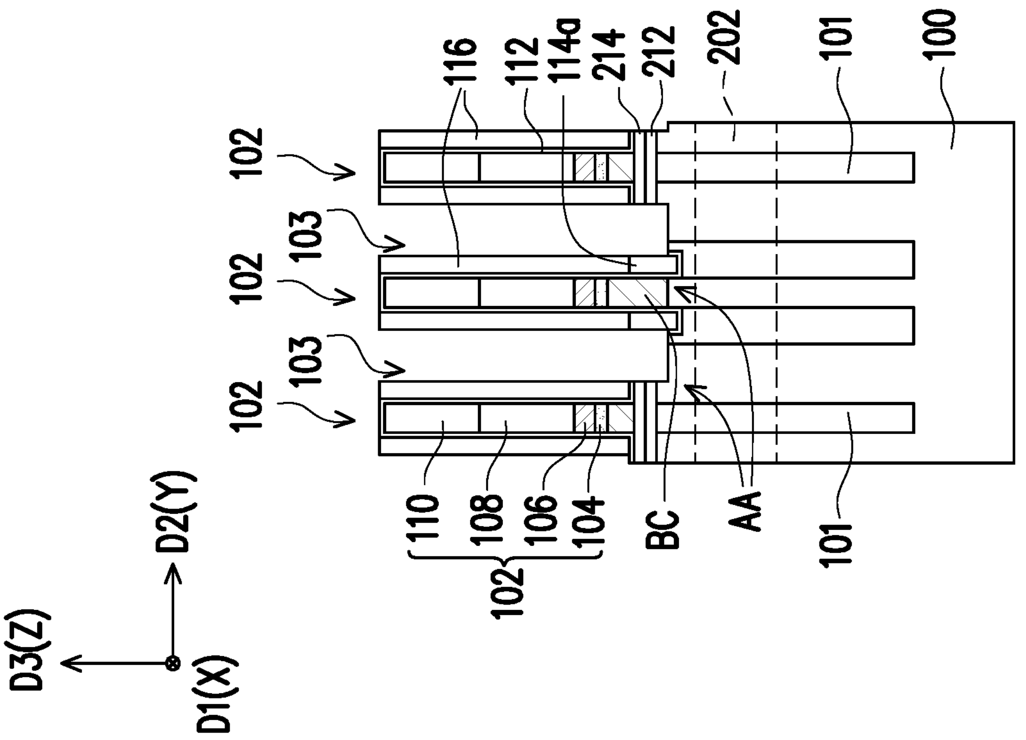

Referring to FIG. 2D, a spacer 116 is formed on the sidewalls of the bit-line structures 102, so that the spacer 116 overlays the filling layer 114*a*. In one embodiment, the spacer 116 is formed by forming a spacer material layer to conformally cover the structure illustrated in FIG. 2C; and performing a second etching process to remove the spacer material layer on the top surface of the bit-line structures 102 and on the top surface of the substrate 100, and further remove a portion of the liner layer 112, a portion of the filling layer 114*a*, a portion of the silicon oxide layer 212, and a portion of the silicon nitride layer 214, thereby exposing the surface of the active areas AA. In one embodiment, the second etching process includes an anisotropic etching process, such as a RIE process.

Figure 2E:
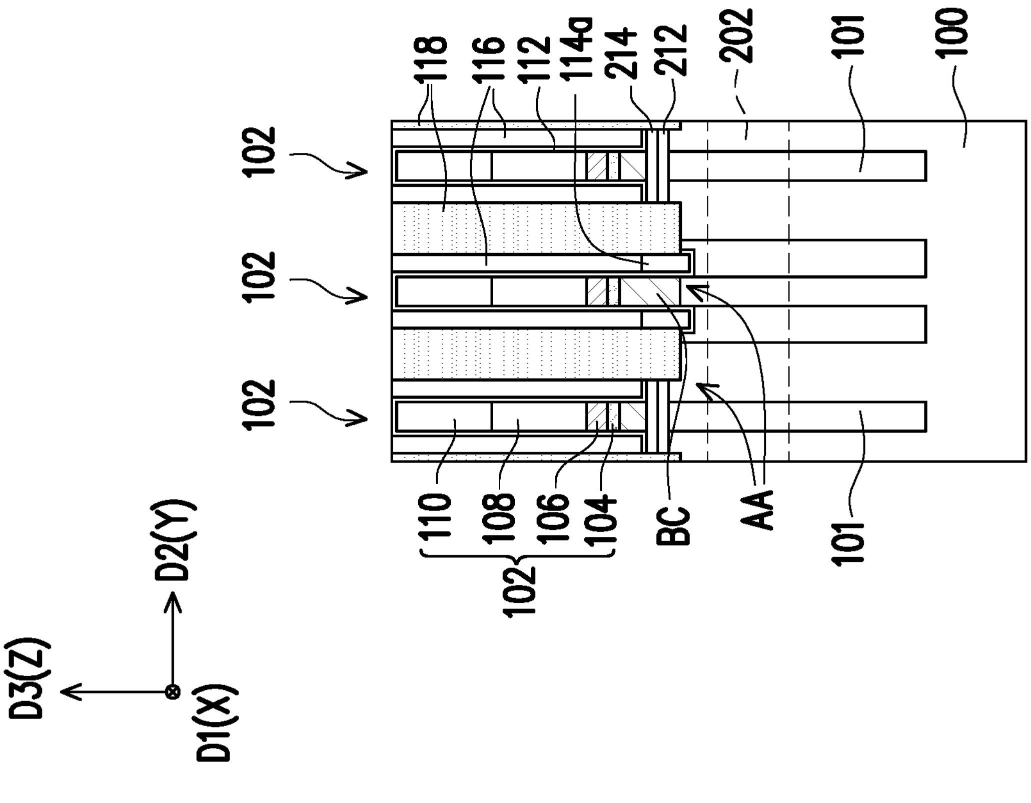

Referring to FIG. 2E, a conductive material 118 is formed to fill in the trenches 103 between the bit-line structures 102 (as shown in FIG. 2D) to contact the active areas AA. In one embodiment, the conductive material 118 includes polysilicon. The conductive material 118 may formed by depositing the conductive material 118 to fill in the trenches 103 and extending to cover the top surface of the bit-line structures 102; and performing a planarization process (such as a chemical mechanical polishing (CMP) process) to remove the excess conductive material 118 overlying the top surface of the bit-line structures 102.

Figure 2F:
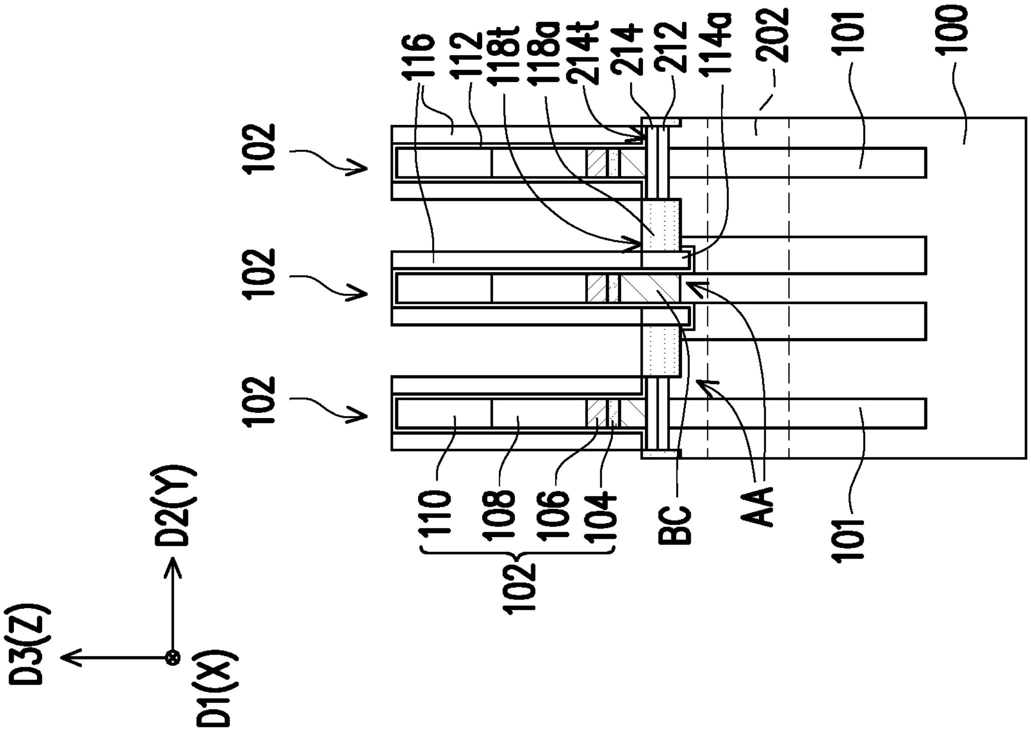

Referring to FIG. 2E and FIG. 2F, an etch-back process is performed to remove a portion of the conductive material 118 to lower the top surface 118*t* of the conductive lines 118*a* to the level between the top surface and the bottom surface of the bit-line contacts BC. In such embodiment, the conductive lines 118*a* may extend along the direction D1 (e.g., the X direction), and are arranged alternately along the direction D2 (e.g., the Y direction).

Figure 2H:
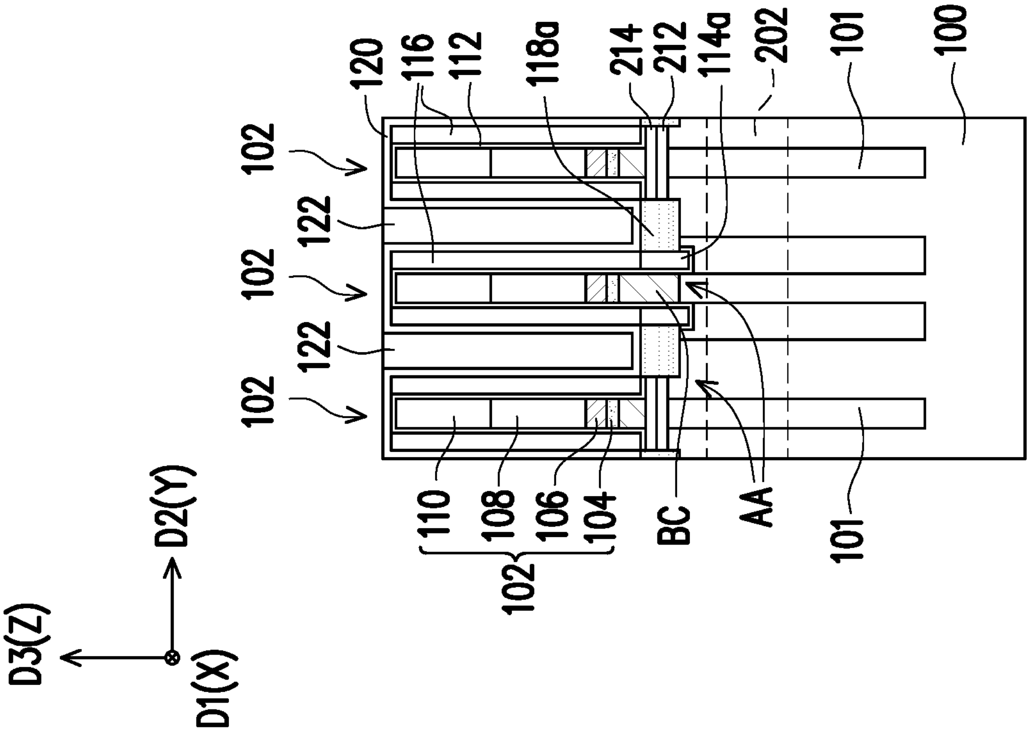
Figure 2G:
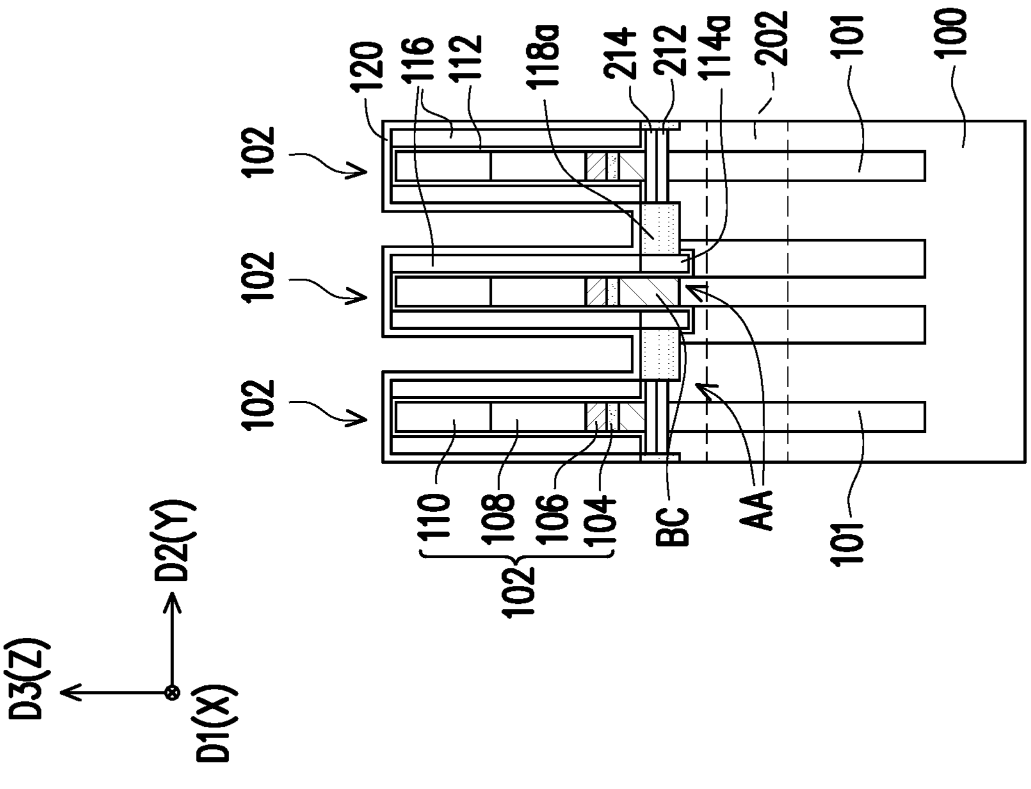

Referring to FIG. 2G, a liner layer 120 is formed to conformally cover the structure illustrated in FIG. 2F. In one embodiment, a material of the liner layer 120 includes a dielectric material, such as silicon oxide, silicon nitride, silicon oxynitride, or a combination thereof. In the present embodiment, the liner layer 120 and the spacer 116 may include different dielectric materials. For example, the liner layer 120 is a silicon nitride layer, while the spacer 116 is a silicon oxide layer.

Referring to FIG. 2H, a sacrificial layer 122 is formed on the liner layer 120 to fill in the trenches 103 between the bit-line structures 102. In one embodiment, a material of the sacrificial layer 122 includes a dielectric material such as silicon oxide, silicon nitride, silicon oxynitride, or a combination thereof. In the present embodiment, the sacrificial layer 122 and the liner layer 120 may include different dielectric materials. For example, the sacrificial layer 122 is spin-on-glass (SOG), while the liner layer 120 is a silicon nitride layer. The sacrificial layer 122 may be formed by depositing a dielectric material to fill in the trenches 103 and extending to cover the top surface of the bit-line structures 102; and performing a planarization process (e.g., the CMP process) to remove the excess dielectric material overlying the top surface of the bit-line structures 102. In this case, the top surface of the sacrificial layer 122 may be level with the topmost surface of the liner layer 120.

Figure 3:
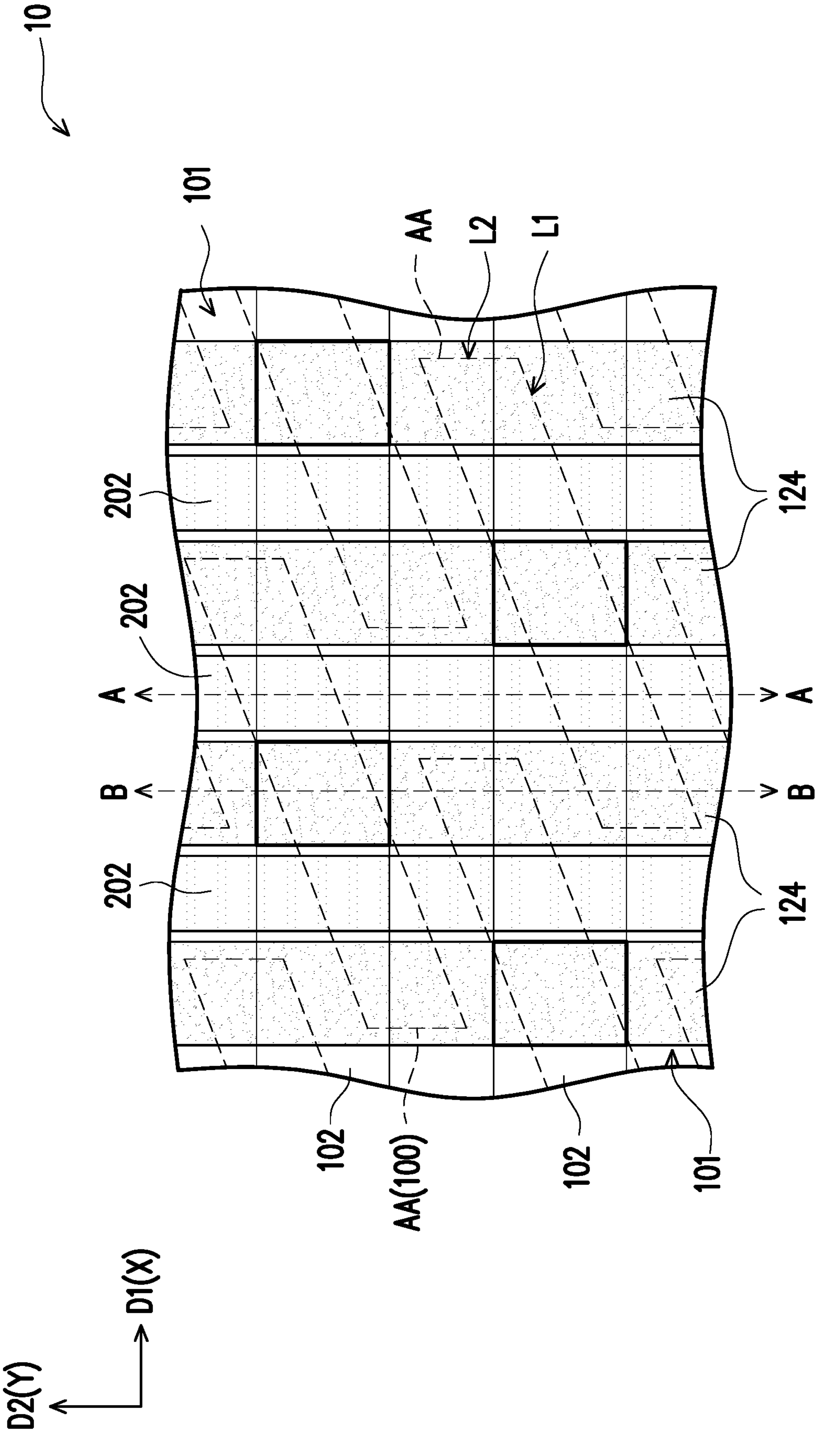
FIG. 3 is a schematic top view of a memory device according to an embodiment of the present invention.

FIG. 3 is a schematic top view of a memory device according to an embodiment of the present invention. FIG. 4A to FIG. 4H are schematic cross-sectional views of a manufacturing process of the memory device along a line A-A exposed by a mask layer 124 depicted in FIG. 3, respectively. FIG. 5A to FIG. 5H are schematic cross-sectional views of a manufacturing process of the memory device along a line B-B covered by a mask layer 124 depicted in FIG. 3, respectively.

Referring to FIG. 3. FIG. 4A to FIG. 4B, and FIG. 5A to FIG. 5B, the bit-line structures 102, the sacrificial layer 122, and the conductive lines 118*a* are patterned to form a plurality of openings 107 arranged along the direction D2. Specifically, a mask layer 124 is formed on the structure illustrated in FIG. 2H. The mask layer 124 extends along the direction D2 and exposes the structure above the embedded word lines 202, as shown in FIG. 3. In one embodiment, the mask layer 124 includes a photoresist layer.

Figure 4A:
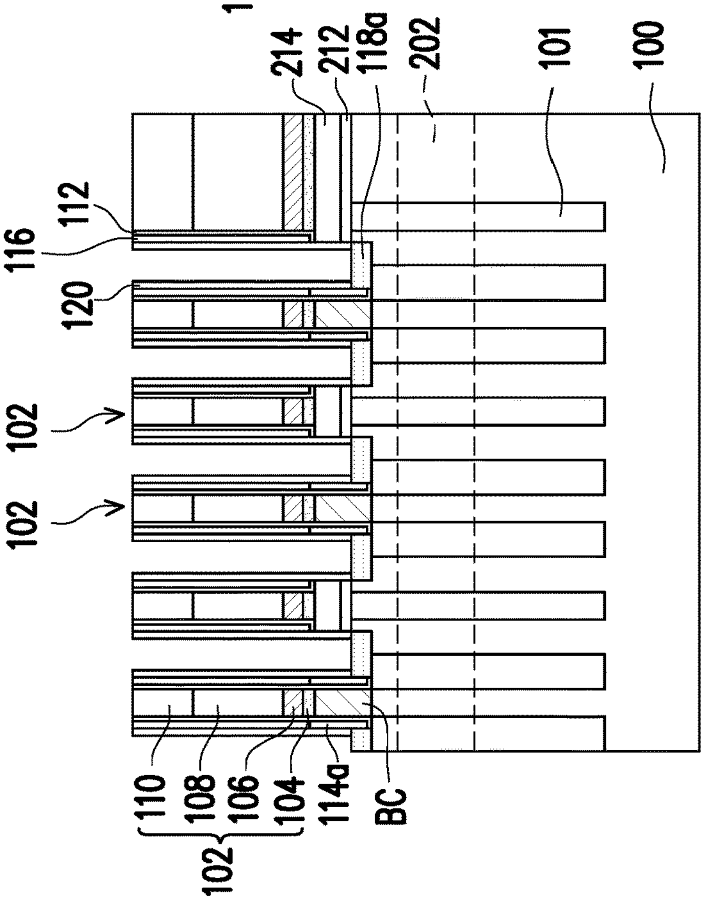
FIG. 4A to FIG. 4H are schematic cross-sectional views of a manufacturing process of the memory device along a line A-A depicted in FIG. 3, respectively.
Figure 5B:
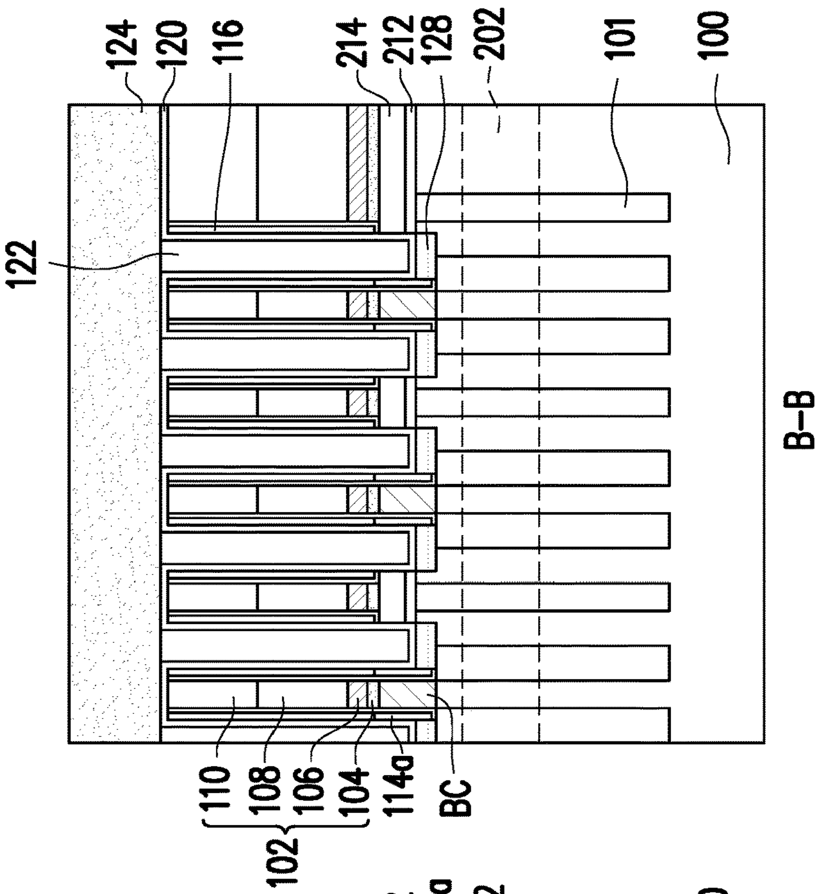
FIG. 5A to FIG. 5H are schematic cross-sectional views of a manufacturing process of the memory device along a line B-B depicted in FIG. 3, respectively.
Figure 5A:
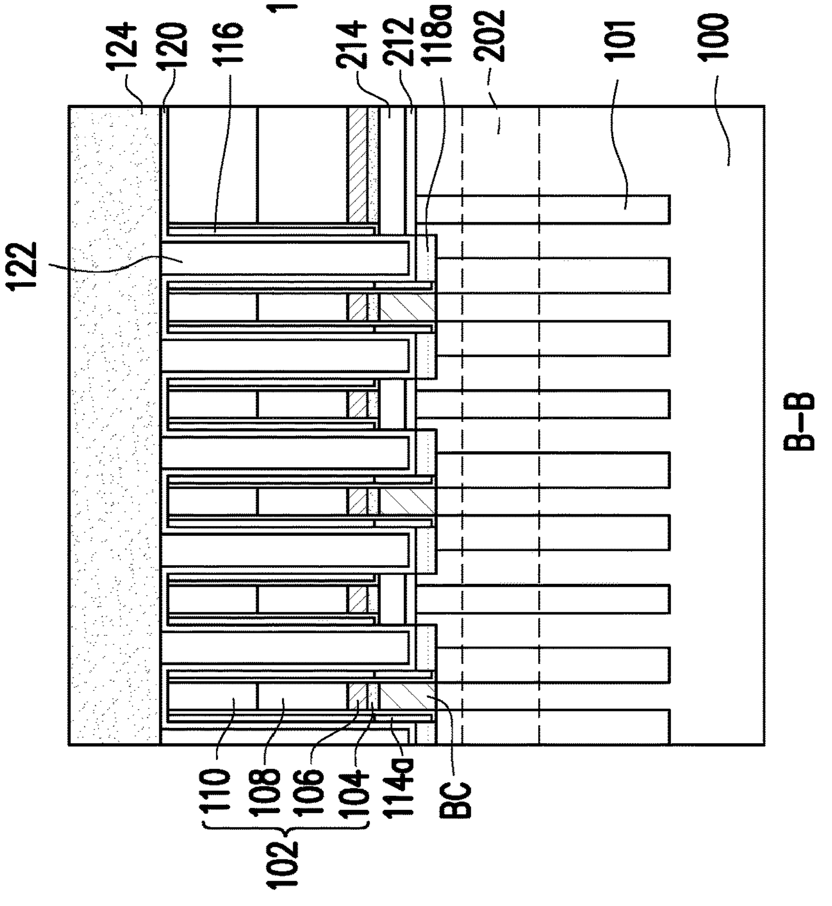

Next, as shown in FIG. 4A and FIG. 5A, by using the mask layer 124 as a mask, the sacrificial layer 122 exposed by the mask layer 124 is removed to expose the conductive lines 118*a*. In addition, a portion of the bit-line structures 102, a portion of the liner layer 112, a portion of the spacer 116, and a portion of the liner layer 120 exposed by the mask layer 124 are also removed.

Figure 4B:
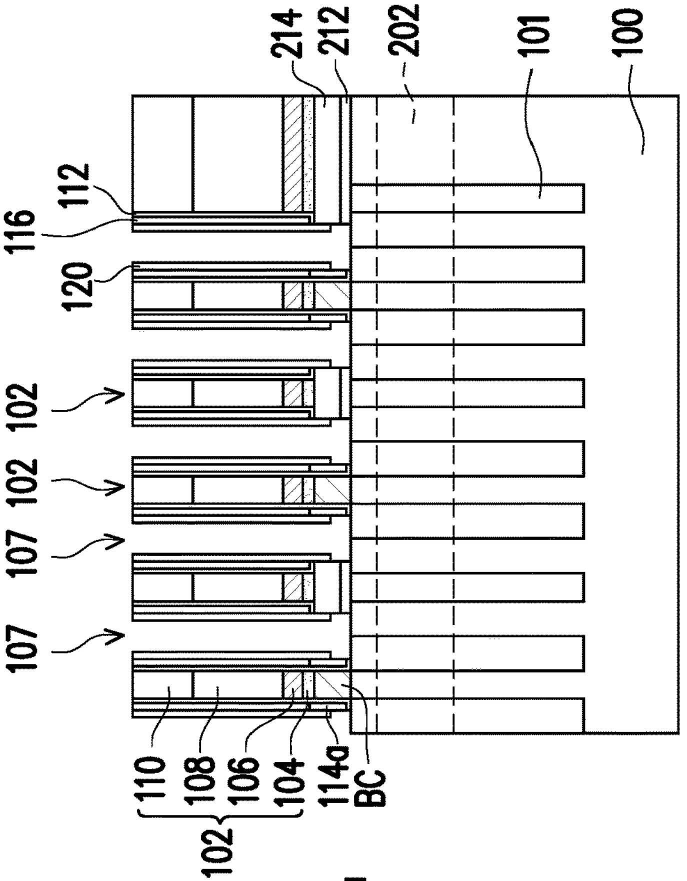

Then, as shown in FIG. 4B and FIG. 5B, by using the mask layer 124 as a mask, the conductive lines 118*a* exposed by the mask layer 124 are removed to expose the substrate 100, thereby forming the openings 107. In this case, the openings 107 cut off the sacrificial layer 122 and the underlying conductive lines 118*a* to form a plurality of conductive pads 128 (as shown in FIG. 5B). In the top view, the conductive pads 128 are respectively disposed aside the bit-line structures 102 to arrange as a conductive array with a plurality of columns and a plurality of rows. In the present embodiment, the conductive array defines the position of the subsequently formed capacitor contacts CC.

Figure 4D:
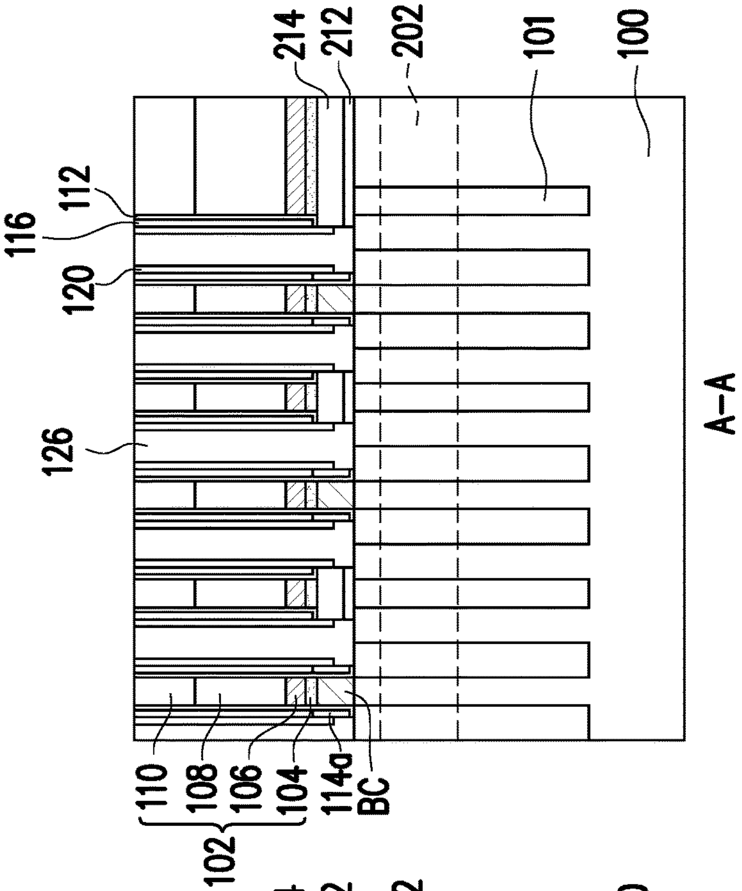
Figure 4C:
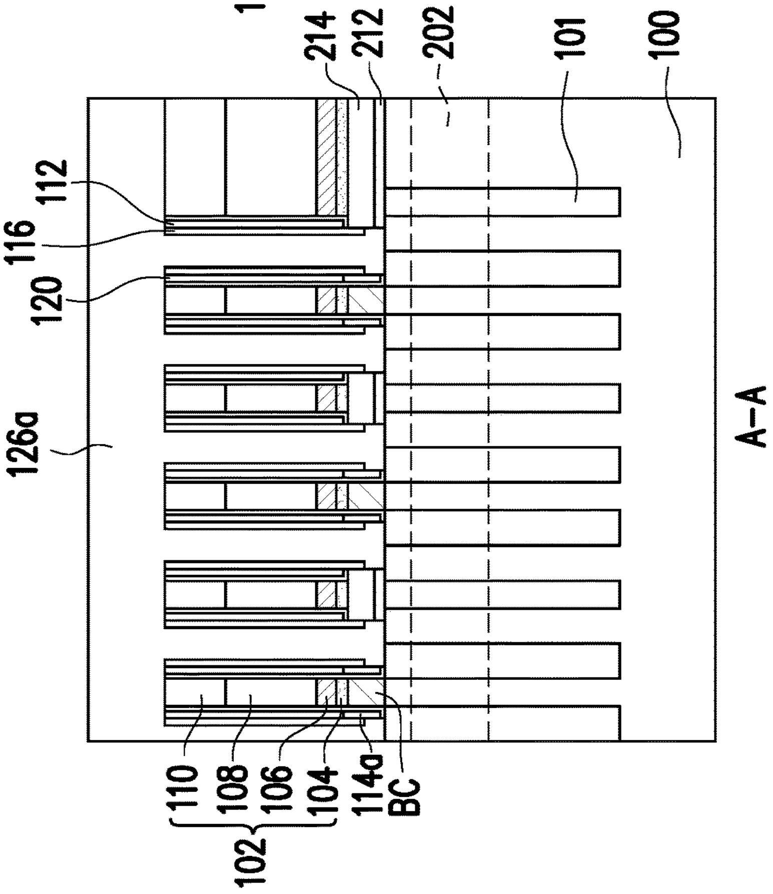
Figure 4E:
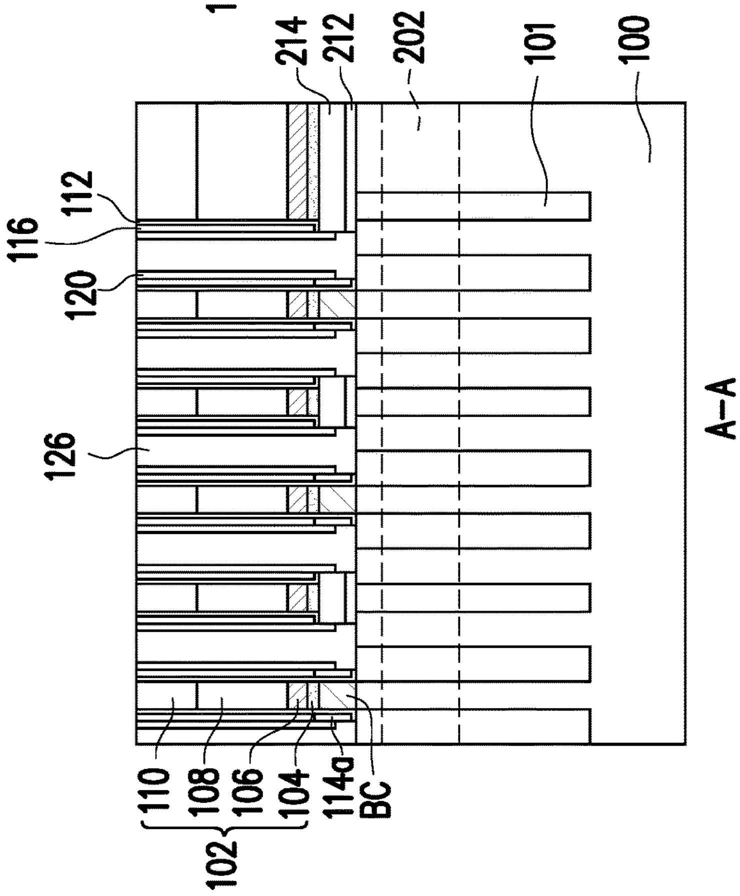
Figure 4F:
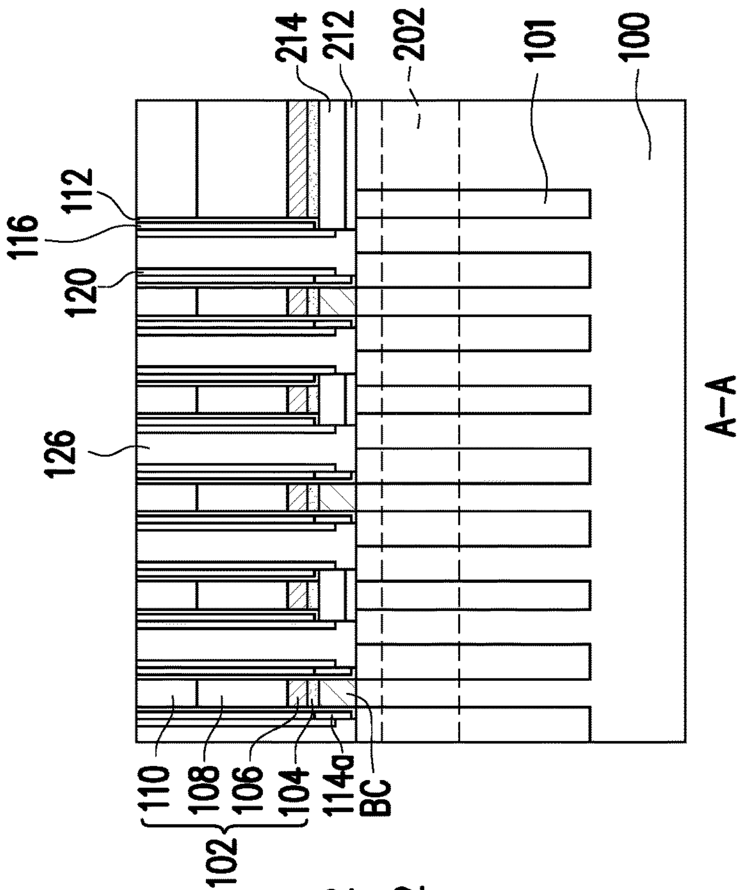
Figure 4H:
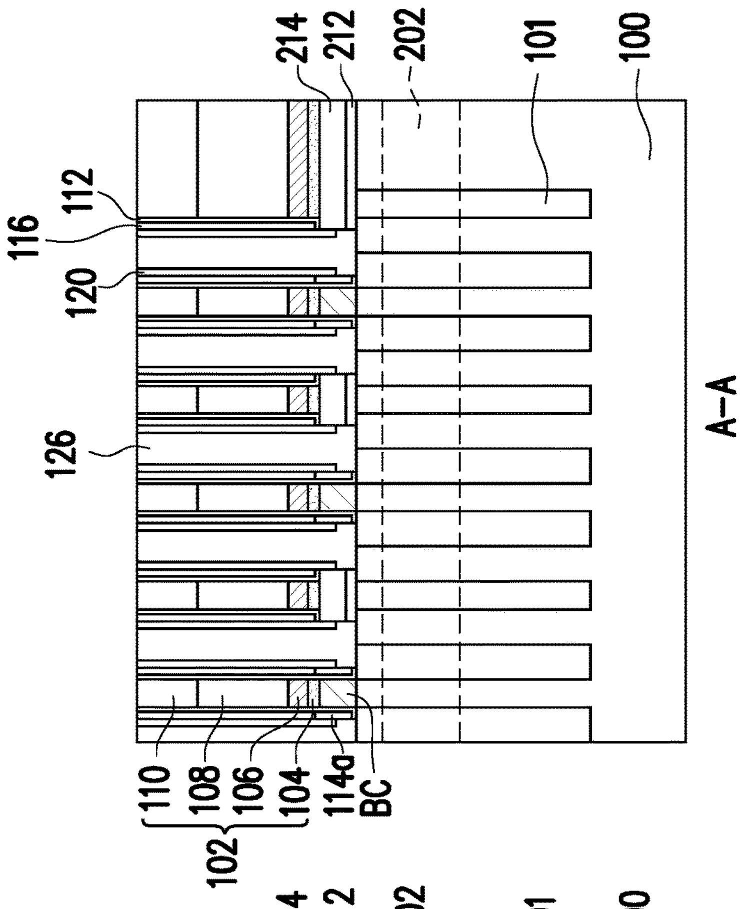
Figure 5C:
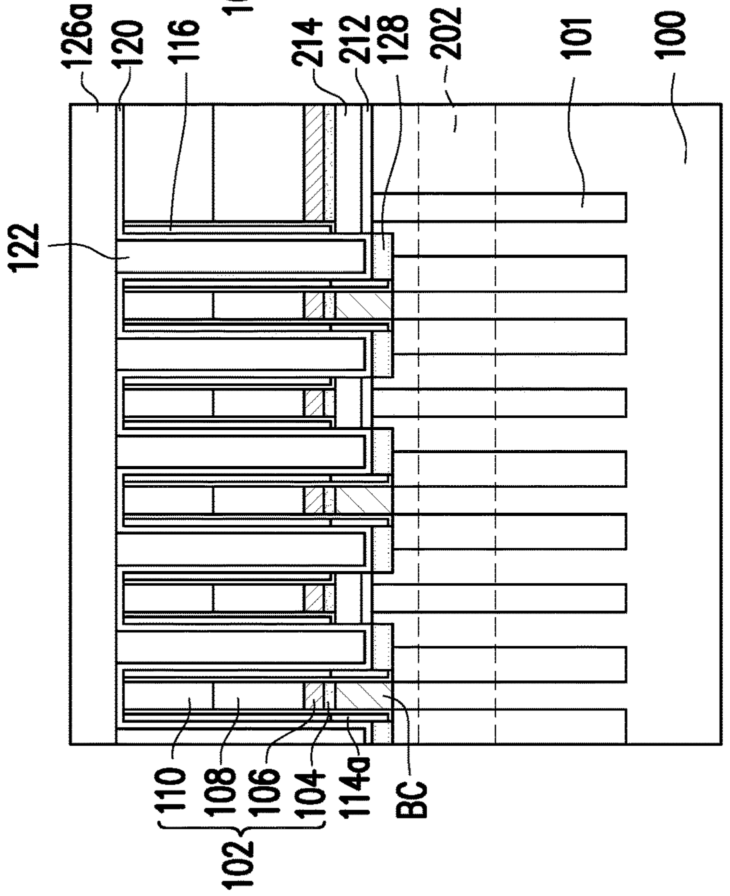
Figure 5D:
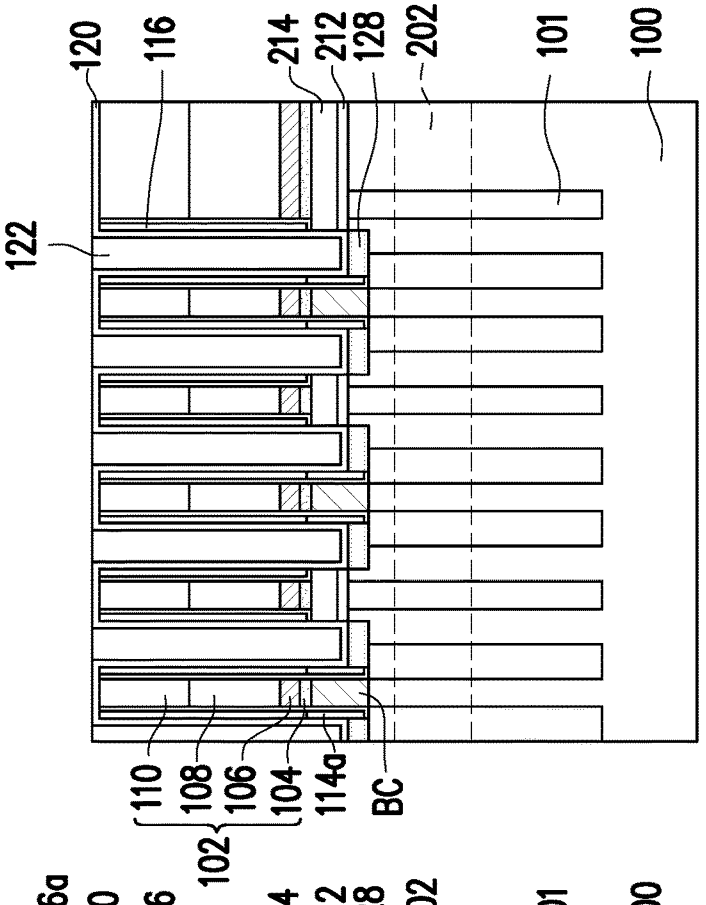
Figure 5F:
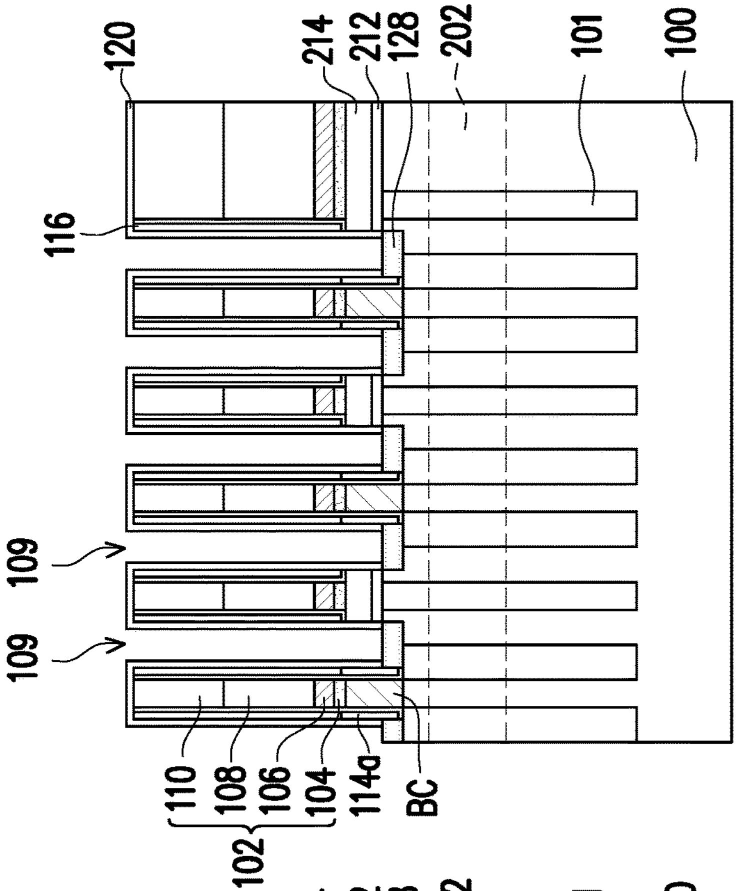
Figure 5E:
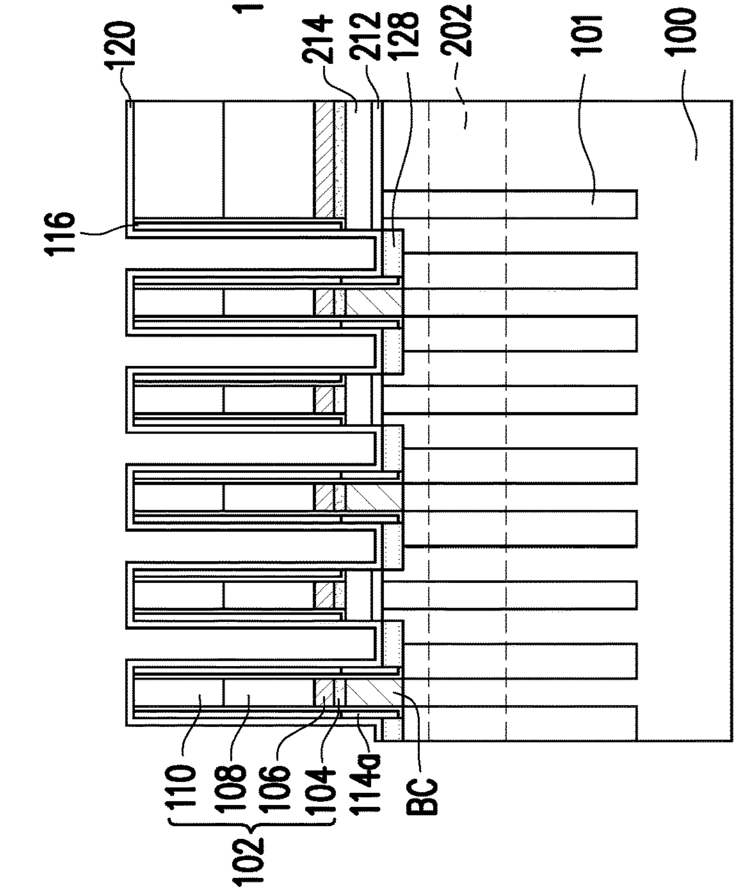

Referring to FIG. 4C to FIG. 4D and FIG. 5C to FIG. 5D, after removing the mask layer 124, a plurality of dielectric layers 126 are formed in the openings 107, respectively. Specifically, a dielectric material 126*a* is formed to fill in the openings 107 and extend to cover the top surface of the bit-line structures 102, as shown in FIG. 4C and FIG. 5C. Afterwards, a planarization process (e.g., a CMP process) is performed on the dielectric material 126*a* to expose the bit-line structures 102 and the sacrificial layer 122, as shown in FIG. 4D and FIG. 5D. In one embodiment, the dielectric material 126*a* includes silicon oxide, silicon nitride, silicon oxynitride, or a combination thereof. In the present embodiment, the dielectric layers 126 and the sacrificial layer 122 may include dielectric materials with different etch selectivities. For example, the dielectric layer 126 is a silicon nitride layer, while the sacrificial layer 122 is a silicon oxide layer.

Referring to FIG. 4D to FIG. 4E and FIG. 5D to FIG. 5E, a wet etching process is performed to remove the sacrificial layer 122, thereby exposing the liner layer 120 over the conductive pads 128. Since the dielectric layers 126 (or the liner layer 120) and the sacrificial layer 122 may include the dielectric materials with different etch selectivities, most of the sacrificial layer 122 may be removed during the wet etching process without or only a small amount of the dielectric layers 126 (or the liner layer 120) is removed.

Referring to FIG. 4E to FIG. 4F and FIG. 5E to FIG. 5F, a third etching process is performed to remove a portion of the liner layer 120 overlying the conductive pads 128, thereby forming a plurality of openings 109 exposing the conductive pads 128. In one embodiment, the third etching process includes an anisotropic etching process, such as a RIE process.

Figure 4G:
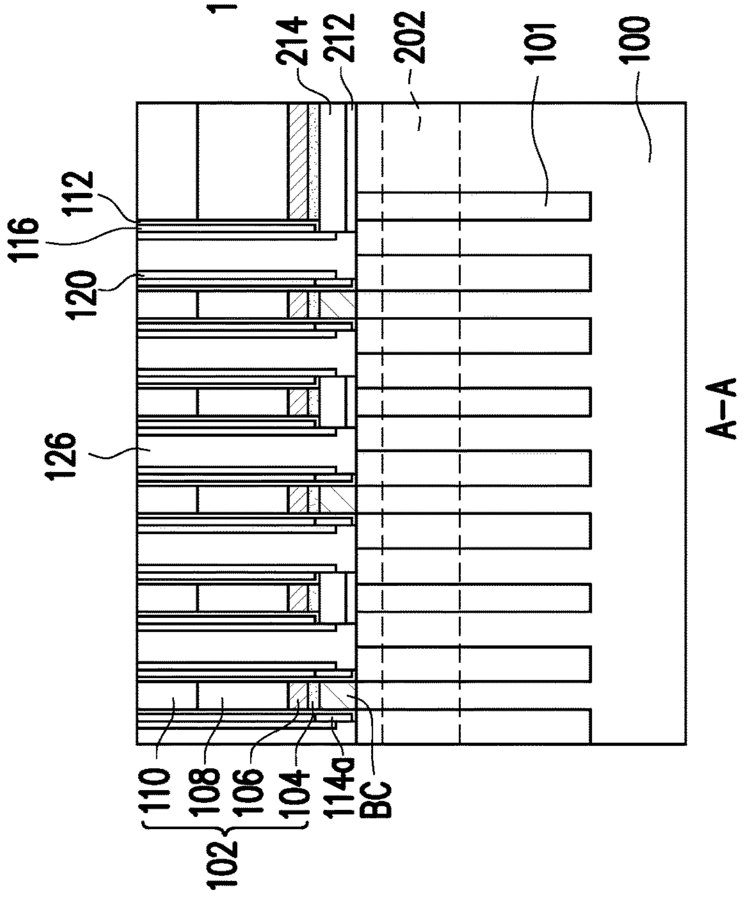

Referring to FIG. 4G to FIG. 4H and FIG. 5G to FIG. 5H, a plurality of conductive plugs 130 are respectively formed on the conductive pads 128. Specifically, a conductive material 130*a* is formed to fill in the openings 109 between the bit-line structures 102. In one embodiment, the conductive material 130*a* includes polysilicon, and may be formed by chemical vapor deposition (CVD). Afterwards, an etch-back process is performed to remove a portion of the conductive material 130*a*, so that the top surface of the conductive plugs 130 is lower than the top surface of the bit-line structures 102. Next, metal layers 132 are respectively formed on the conductive plugs 130. In an embodiment, a material of the metal layer 132 may be, for example. W. and may be formed by physical vapor deposition (PVD). In addition, a thin metal silicide layer, such as tungsten silicide ($WSi_x$), may also be provided between the conductive plug 130 and the metal layer 132. Herein, as shown in FIG. 4G, the composite structure of the conductive plug 130 and the metal layer 132 may be regarded as the capacitor contact CC. The capacitor contacts CC may be disposed on two terminals of the active areas AA to electrically connect the active areas AA with a subsequently formed capacitors (not shown).

Figure 5H:
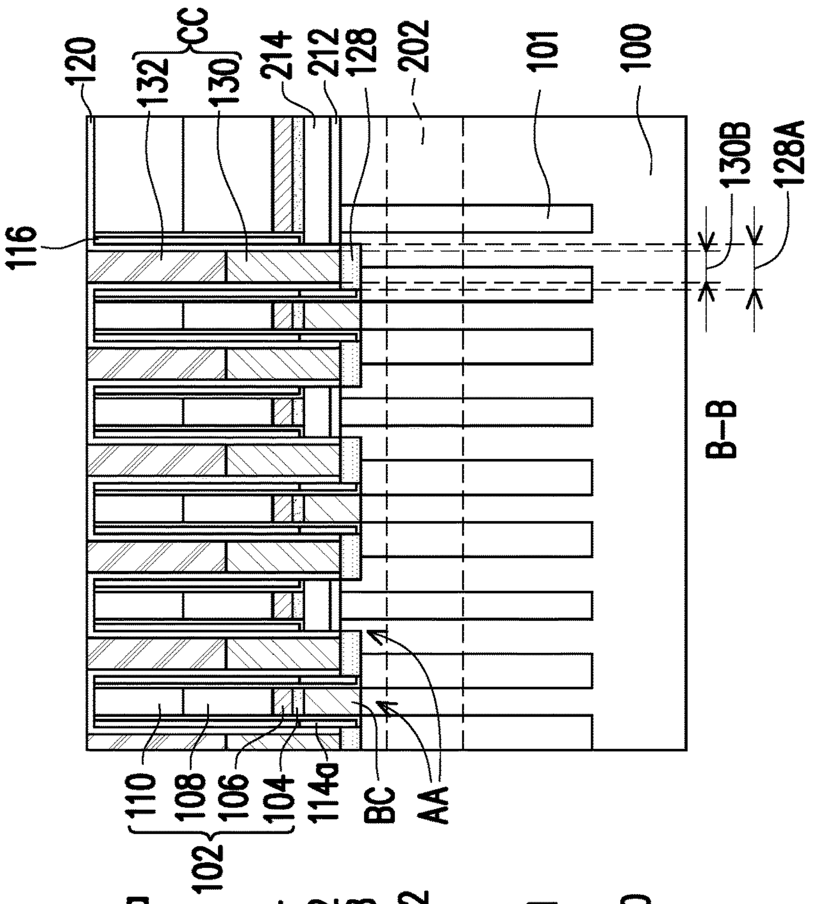
Figure 5G:
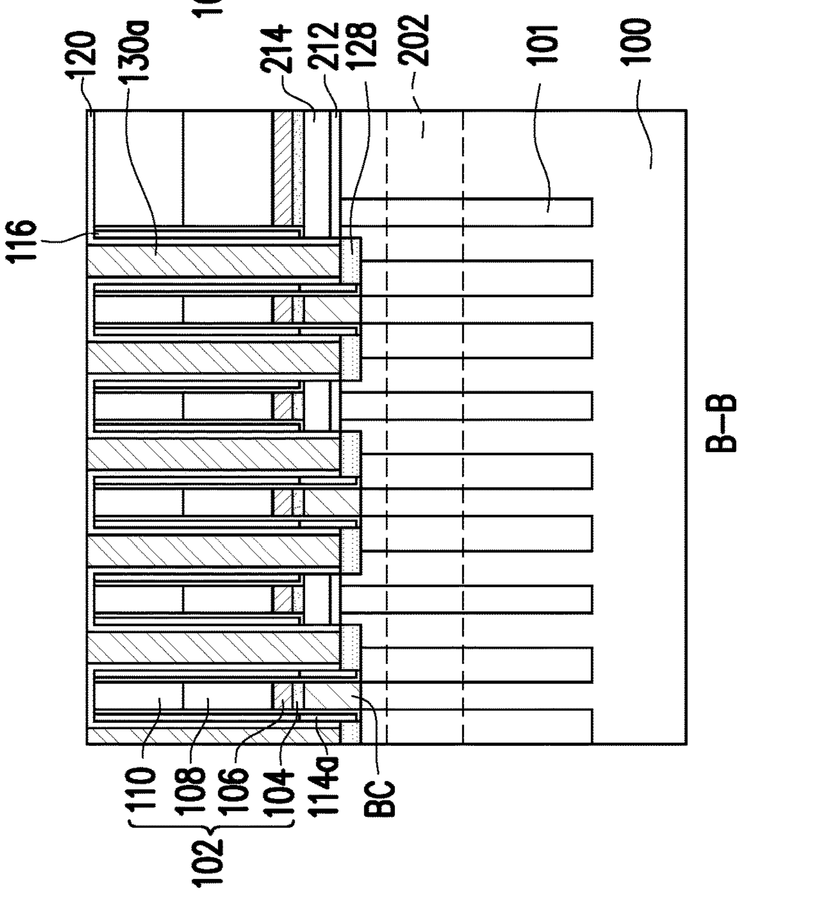

It should be noted that, as shown in FIG. 5H, in the present embodiment, the top area 128A of each conductive pad 128 is greater than the bottom area 130B of the corresponding conductive plug 130. That is, the bottom area

130B of each conductive plug 130 falls within the range of the top area 128A of the corresponding conductive pad 128. In this case, even if the misalignment occurs due to the process variation when forming the conductive plug 130, the conductive plug 130 can be in direct contact with the conductive pad 128 to avoid the short issue between the capacitor contact CC and the active area AA, thereby increasing the process window. In addition, since the conductive pad 128 is formed before forming the conductive plug 130, the contact area between the conductive pad 128 and the active area AA will not be affected by subsequent process variation. In other words, the present embodiment can maximize the contact area between the conductive pad 128 and the active area AA, so as to minimize the resistance of the capacitor contact CC landing on the conductive pad 128, thereby enhancing the reliability and the performance of the memory device.

To sum up, the embodiment of the present invention provides a memory device and a method of forming the same which uses a plurality of conductive pads vertically disposed between a plurality of conductive plugs and a plurality of active areas to reduce the contact resistance between the capacitor contacts and the active areas. As such, even if the misalignment occurs due to the process variation, the short issue between the capacitor contact and the active area can also be avoided, thereby increasing the process window and enhancing the reliability of the memory device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:

a substrate, having a plurality of active areas;

a plurality of bit-line structures, disposed on the substrate in parallel;

a plurality of conductive plugs, respectively disposed aside the plurality of bit-line structures, and electrically connected to the plurality of active areas; and a plurality of conductive pads, vertically disposed between the plurality of conductive plugs and the plurality of active areas, wherein a perimeter of one of the plurality of conductive plugs falls entirely within a perimeter of a corresponding conductive pad in a top view, wherein the plurality of conductive pads are embedded in the substrate, and a top surface of the plurality of conductive pads is level with a top surface of the plurality of active areas.

2. The memory device according to claim 1, further comprising: a liner layer disposed between the plurality of conductive plugs and the plurality of bit-line structures, wherein the liner layer has a bottom surface in contact with a top surface of the plurality of conductive pads.

3. The memory device according to claim 1, wherein the plurality of conductive pads are in direct contact with the plurality of active areas.

4. The memory device according to claim 2, wherein a material of the liner layer comprises a dielectric material.

5. The memory device according to claim 2, wherein the liner layer electrically isolates the plurality of conductive plugs from the plurality of bit-line structures.

6. The memory device according to claim 1, further comprising a bit-line contact disposed between each active area and a corresponding bit-line structure.

7. The memory device according to claim 6, wherein a bottom surface of the plurality of conductive pads is level with a bottom surface of the bit-line contact.

8. The memory device according to claim 1, wherein the plurality of conductive pads are respectively disposed beside the plurality of bit-line structures to form a conductive array.

* * * * *